US011770915B2

(12) United States Patent
Legendre et al.

(10) Patent No.: US 11,770,915 B2
(45) Date of Patent: Sep. 26, 2023

(54) ELECTRICAL EQUIPMENT COMPRISING A BUSBAR COOLED BY TWO FACES OF A HEATSINK

(71) Applicant: Valeo Siemens eAutomotive France SAS, Cergy (FR)

(72) Inventors: Alexandre Legendre, Jouy-Le-Moutier (FR); Aurélien Pouilly, Poissy (FR)

(73) Assignee: Valeo Siemens eAutomotive France SAS, Cergy (FR)

( * ) Notice: Subject to any disclaimer, the term of this patent is extended or adjusted under 35 U.S.C. 154(b) by 279 days.

(21) Appl. No.: 17/123,675

(22) Filed: Dec. 16, 2020

(65) Prior Publication Data
US 2021/0195787 A1    Jun. 24, 2021

(30) Foreign Application Priority Data

Dec. 18, 2019  (FR) ...................... 1914810

(51) Int. Cl.
*H05K 7/20* (2006.01)
*H02M 7/00* (2006.01)

(52) U.S. Cl.
CPC ............ *H05K 7/209* (2013.01); *H02M 7/003* (2013.01); *H05K 7/20936* (2013.01)

(58) Field of Classification Search
CPC .. H05K 7/209; H05K 7/20936; H05K 7/2039; H02M 7/003
See application file for complete search history.

(56) References Cited

U.S. PATENT DOCUMENTS

| 5,574,312 A | 11/1996 | Bayerer et al. |
| 2004/0256710 A1 | 12/2004 | Schwarzbauer et al. |
| 2006/0207780 A1 | 9/2006 | Shinmura et al. |
| 2014/0062210 A1* | 3/2014 | Wagoner ............ H05K 7/14329 307/89 |
| 2022/0201892 A1* | 6/2022 | Bohlländer ........... H02M 7/003 |

FOREIGN PATENT DOCUMENTS

WO    WO 2013/136877 A1    9/2013

OTHER PUBLICATIONS

Search Report from French Intellectual Property Office on corresponding FR application (FR1914810) dated Sep. 2, 2020.

* cited by examiner

*Primary Examiner* — Adolf D Berhane
*Assistant Examiner* — Afework S Demisse
(74) *Attorney, Agent, or Firm* — KOS IP LAW LLP

(57) ABSTRACT

The invention relates to electrical equipment comprising:
 a heatsink comprising an internal volume delimited by at least two opposite faces,
 a busbar,
said busbar coming against said two opposite faces of the heatsink in such a way as to be cooled by said heatsink.

20 Claims, 2 Drawing Sheets

[Fig. 1]
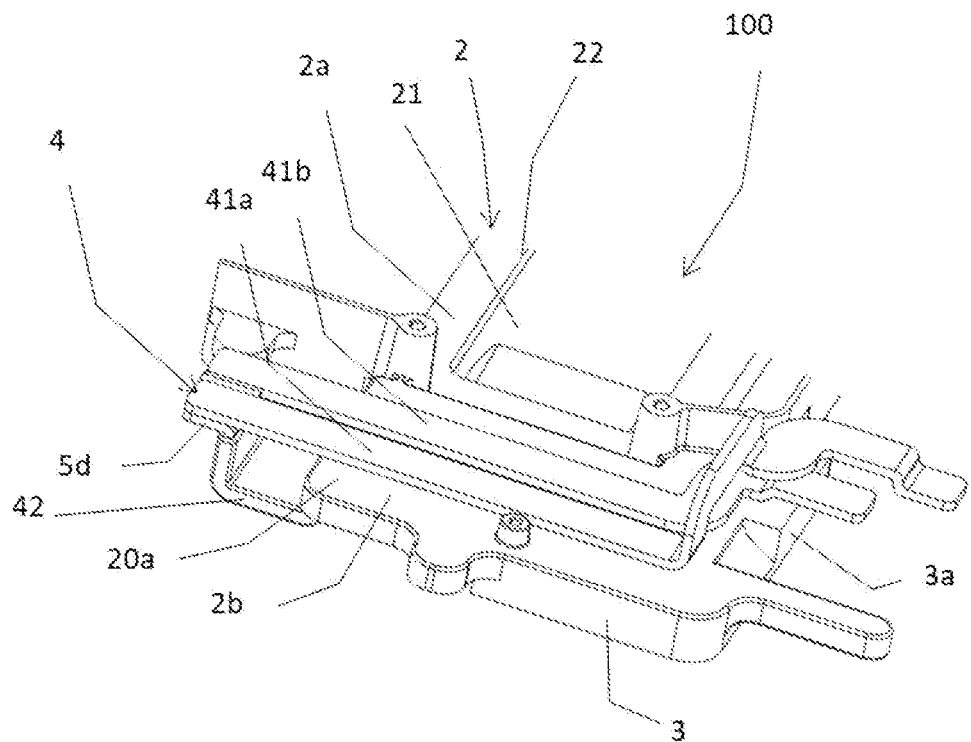
[Fig. 2]
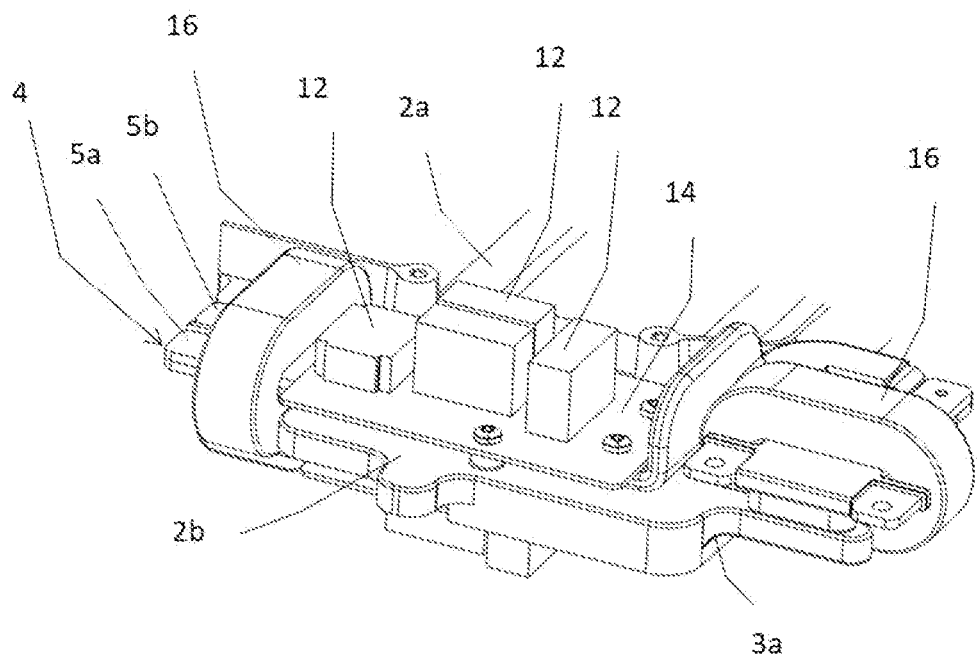

[Fig. 3]
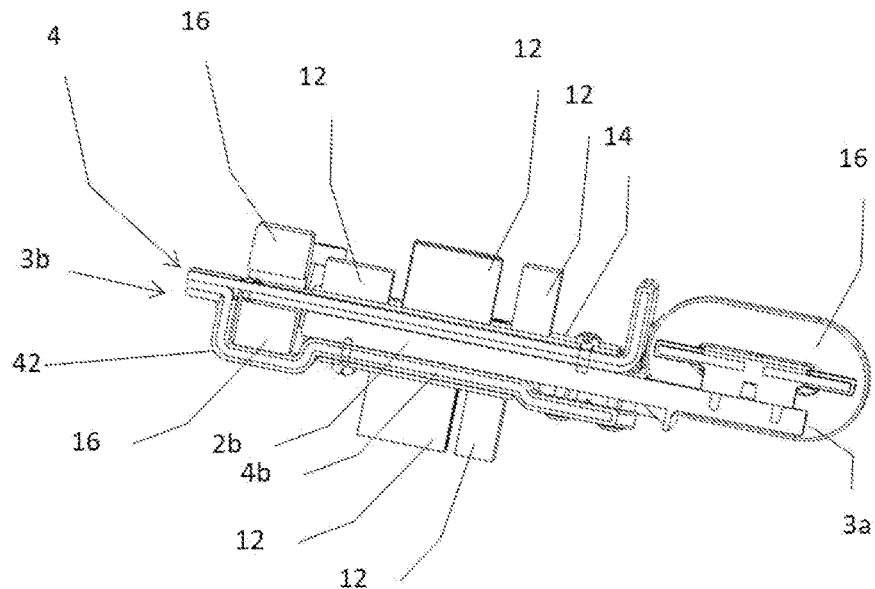
[Fig. 4]
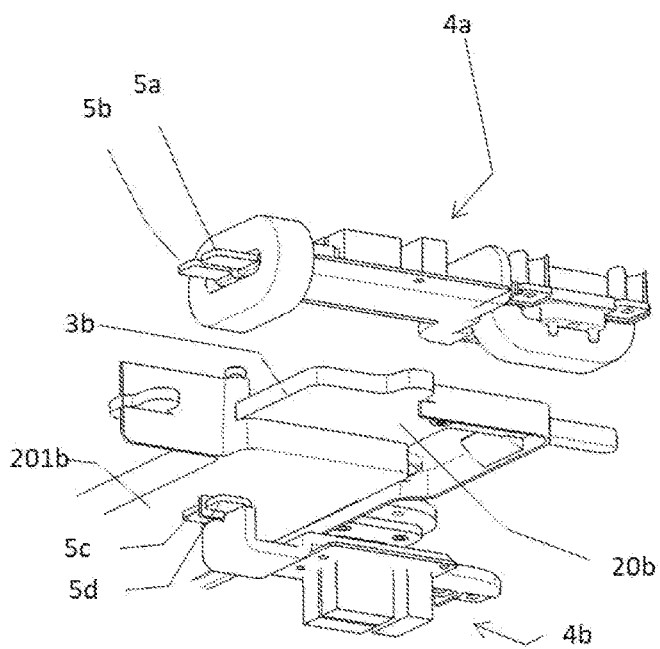
[Fig. 5]
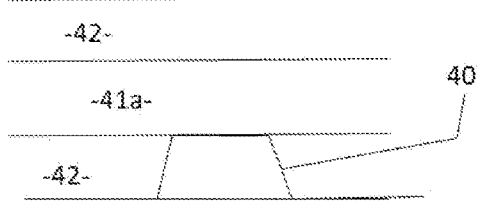

ELECTRICAL EQUIPMENT COMPRISING A BUSBAR COOLED BY TWO FACES OF A HEATSINK

TECHNICAL FIELD

The present invention relates to the field of electrical equipment, in particular for electric or hybrid vehicles, and more precisely relates to the cooling of electrical systems such as inverters connected to the motor in electrical motorization systems.

PRIOR ART

It is known to use electrical equipment that has busbars. In particular, such busbars are intended to convey electrical energy from an interface, in particular an external interface, of the electrical equipment to an internal component of the electrical equipment. For example, the busbar connects a terminal of the electrical equipment with a capacitor of the electrical equipment. The busbar generally comprises a leadframe, in particular made of metal, maintained by a body made from an electrically insulating material, in particular plastic. Electronic components can be received on the busbar in order to allow for a filtering of the signal flowing in the leadframe. During the passing of the current in the busbar, the heat given off by the electrical conductor and/or the filtering components can damage the other components of the electrical equipment, in particular the capacitor, which already generates heat via the Joule effect due to its own operation.

To cool the busbars, it is known to have them pass along a cooling box provided with a system for circulating a cooling liquid. However, this can be insufficient, in particular when the electrical equipment is operating at a high voltage, i.e. at a voltage higher than 60V, even 80V or 100V or 400V or 800V. In particular, the electrical equipment can operate between 50 kW and 300 kW.

A cooling solution is therefore sought that allows for an improved dissipation of heat of leadframes.

SUMMARY

For this purpose, a piece of electrical equipment is proposed comprising:
a heatsink comprising an internal volume delimited by at least two opposite faces,
a busbar,
the busbar coming against said two opposite faces of the heatsink in such a way as to be cooled by the heatsink.

The busbar is therefore cooled by the two opposite faces of the heatsink. In the prior art, only one face of the heatsink is used to cool the busbar. Thus, thanks to the integration of the busbar with the heatsink, the cooling of the busbar is increased in relation to the prior art. In particular, said busbar comes into direct contact with said two opposite faces of the heatsink, or comes against the opposite faces of the heatsink via one or more intermediate layers.

According to an embodiment, the busbar extends along the two opposite faces in such a way as to surround the heatsink.

According to an embodiment, the heatsink comprises a first side at which said two opposite faces are connected, said busbar extending along said heatsink from the first side returning to said first side.

In an alternative, an input terminal and an output terminal of the busbar are at said first side of the heatsink.

In an alternative, the heatsink comprises a second side at which said two opposite faces are connected, said second side being opposite the first side. Said busbar extends along said heatsink from the first side to the second side, then from the second side to the first side.

According to an embodiment, the busbar comprises two portions assembled together, the first portion coming against a first of said faces of the heatsink and the second portion coming against the second of said faces of the heatsink, in such a way as to surround the heatsink.

According to an alternative, the first portion and the second portion of the busbar are assembled together at second edge of the heatsink.

According to an embodiment, the busbar is made from a single piece by surrounding the heatsink.

According to an embodiment, the busbar comprises a coating surrounding a leadframe, the coating comprising an opening coming across from a portion of the heatsink, the opening comprising an electrically insulating heatsink material in such a way as to improve the cooling of said leadframe.

According to an embodiment, the busbar supports at least one electrical component. In an alternative, the electrical component is an EMC filtering component.

In an alternative, the electrical component is sandwiched between the busbar and the heatsink.

According to an embodiment, at least one of said faces of the heatsink is configured to cool other components on at least one surface not covered by the busbar.

According to an alternative, the first face of the heatsink receives an electronic power module and the second face of the heatsink receives a capacitive module at surfaces not covered by the busbar.

According to an alternative, the heatsink comprises at least one cooling channel configured to receive a cooling fluid, the cooling channel being at least partially in the zone not covered by the busbar, and the portion of the heatsink surrounded by the busbar being devoid of a cooling channel.

BRIEF DESCRIPTION OF THE DRAWINGS

The invention will be better understood and other details, characteristics and advantages of the invention shall appear when reading the following description given as a non-limiting example in reference to the accompanying figures.

FIG. 1 shows a perspective view of an example of a piece of electrical equipment according to the invention.

FIG. 2 shows a perspective view of the electrical equipment of FIG. 1, wherein the busbar is provided with components.

FIG. 3 shows a cross-section view of the electrical equipment of FIG. 2.

FIG. 4 shows an exploded view of the electrical equipment of FIG. 2.

FIG. 5 shows a detailed view of an alternative of the electrical equipment of FIG. 2.

DETAILED DESCRIPTION

The electrical equipment 100 such as shown in FIG. 1 comprises a heatsink 2, which comprises an internal volume delimited by at least two opposite faces 20a, 20b. In the example shown, a portion of the heatsink 2 called main portion 2a, can comprise a cooling channel 21 configured to receive a cooling fluid. Another portion of the heatsink, called auxiliary portion 2b, is then devoid of a cooling channel. The auxiliary portion 2b is in particular cooled by heat conduction from the auxiliary portion 2b to the main portion 2a where the heat is drained by the cooling fluid flowing in the cooling channel 21. In other words, the auxiliary portion 2b forms a protrusion of material from the main portion 2a. By not providing a cooling channel in the auxiliary portion 2b, its size and the final size of the electrical equipment 100 are thus limited. The heatsink 2 can have a substantially rectangular shape. However, the auxiliary portion 2b could receive a cooling channel, which would increase its size but would improve the heat dissipation at the auxiliary portion 2b. But an auxiliary portion 2b devoid of a cooling channel is sufficient for a cooling of a busbar, in particular such as described hereinafter. The auxiliary portion 2b could be made from a material different from that of the main portion 2a. In particular the auxiliary portion 2b could be made of a material with a thermal conductivity that is higher than that of the main portion 2a. For example, the main portion 2a is made from aluminum and the auxiliary portion 2b is made from copper. However, the cost could be substantially higher.

The two opposite faces 20a, 20b can have a substantially identical contour. They can be superimposed in a substantially parallel manner. The contours of the two opposite faces 20a, 20b are in particular connected by a wall 3 all along the contours. Alternatively, the contours of the two opposite faces can be connected directly between them, in particular without a wall 3. For the positioning of a component or for the passing of a connection, or other, the opposite faces 20a, 20b can comprise notches, openings or other differences with respect to the other opposite face 20a, 20b.

The electrical equipment comprises a busbar 4. The busbar 4 can comprise two leadframes 41a, 41b, in particular a negative leadframe 41a and a positive leadframe 41b. The leadframes 41a, 41b are in particular made of metal, for example of copper. They form rigid parts which are maintained together by a coating 42 made of an electrically insulating material, deposited for example by overmolding. In FIG. 1, a portion of the coating 42 is not shown in order to render the leadframes 41a, 41b visible. The leadframes 41a, 41b connect in particular terminals of the electrical equipment 100 with a capacitor of the electrical equipment 100.

The busbar 4 comes into contact against the two opposite faces 20a, 20b of the heatsink 2 in such a way as to be cooled by the heatsink 2. Thus, the busbar 4 benefits from the two faces of the heatsink 2 to be cooled. The integration of the busbar 4 into the electrical equipment 100 is improved in relation to the prior art. The cooling of the busbar 4 is improved while still controlling the size of the electrical equipment 100. The busbar 4 extends in particular along two opposite faces 20a, 20b of the heatsink 2 in such a way as to surround the heatsink 2. The busbar 4 can therefore be cooled over its entire length. The surfaces of the busbar 4 that are cooled are therefore increased with respect to the prior art. The cooling of the busbar 4 is then higher, the risk of damage by the heat therefore decreases substantially. Furthermore, by surrounding the heatsink 2, the busbar 4 is integrated with the heatsink 2.

In particular, the busbar 4 starts from a first side 3a of the heatsink 2; extends along the auxiliary portion 2b, in particular along the portion of the first face 20a comprised in the auxiliary portion 2b. The busbar 4 then joins the second face 20b by a second side 3b of the heatsink 2, and again runs along the auxiliary portion 2b, in particular along the portion of the second face 20b comprised in the auxiliary portion 2b, to return to the first side 3a. Thus, the busbar 4 forms a loop around the heatsink 2, in particular around the auxiliary portion 2b. Returning to the first side 3a, the electrical connections to the busbar 4, for example the connection to a terminal of the electrical equipment 100 or the connection to a capacitor of the electrical equipment 100, can be provided on the same side 3a of the heatsink 2. In particular from an industrial standpoint, during the manufacturing of the electrical equipment 100, this arrangement makes it possible to connect the busbar 4 more easily. The two connections can therefore be carried out from the same side of the heatsink 2, without turning over the electrical equipment 100; which makes it possible to save a manufacturing step and time as well. Unnecessary manipulations of the electrical equipment 100 during the assembly are therefore avoided and/or a quality inspection is therefore facilitated. In particular, the second side 3b is opposite the first side 3a. However, this second side 3b could be a side of the heatsink 2 which is adjacent to the first side 3a.

The busbar 4 comprises in particular two portions 4a, 4b assembled together in such a way as to surround the heatsink 2. The first portion 4a comes against the first face 20a of the heatsink 2; and the second portion 4b comes against the second face 20b of the heatsink 2. Thus, the assembly of the busbar 4 around the heatsink 2 can be done in several steps. In particular, the first portion 4a and the second portion 4b of the busbar 4 are assembled together at the second side 3b of the heatsink 2. In particular, the leadframes 41a, 41b each comprise a first portion coming against the first face 20a and a second portion coming against the second face 20b. As shown for example in FIG. 4, ends 5a, 5b of the first portions of the leadframes 41a, 41b come against respective ends 5c, 5d of the second portions of the leadframes 41a, 41b. These ends 5a, 5b, 5c, 5d are connected by welding, brazing, screwing or any other means of fastening. The arrangement described hereinabove allows for an assembly of the busbar 4 with the heatsink 2 along a single axis.

Alternatively, the busbar 4 could be of a single piece by surrounding the heatsink 2. The leadframes 41a, 41b are then each of a single piece, and in particular extend continuously from the first face 20a to the second face 20b. This alternative makes it possible on the contrary to save parts, for example parts that connect the first 4a and second 4b portions of the busbar 4, and/or pre-assembly steps. Furthermore, any assembly in an incorrect direction is avoided.

As for example shown in FIG. 5, the coating 42 of the busbar 4 can comprise one or more openings 40 facing the heatsink 2. The opening 40 exposes in particular a surface of the leadframe 41a, 41b. This opening 40 is then filled with an electrically insulating material, but which conducts heat which acts in such a way as to improve the cooling of the leadframe 41a, 41b. The material can be a thermal grease or a flexible material, such as for example a "gap pad"® or any other material with the dual characteristics of electrical insulation and thermal conduction.

As for example shown in FIGS. 2, 3 and 4, the busbar 4 can support components 12, 16. In particular filtering components 12 and magnetic cores 16, required for filtering. These components 12, 16 can be assembled on an electronic board 14, which itself is mounted on the busbar 4, in particular on the coating 42 of the busbar 4. The electronic board 14 receives in particular electrical elements of small size, of which a direct assembly on the busbar 4 would be difficult. The filtering makes it possible to decrease the EMC electromagnetic field linked to the current flowing in the busbar 4 so as to protect the components of the electrical equipment 100. Other components can be placed on another electronic board and connected to the busbar 4 by cables, bundles or a rigid connector.

Alternatively, the components 12, 16 can be mounted directly on the busbar 4, without the intermediary of the electronic board 14. In this case the components 12, 16 can be welded, brazed or fastened by any other method of fastening on the busbar 4.

In particular, the busbar 4 comes against the heatsink 2 at the auxiliary portion 2b of the heatsink 2. The busbar 4 covers only one zone on the heatsink 2. Preferably, the busbar 4 covers only one zone of the auxiliary portion 2b of the heatsink 2. The remainder of the heatsink 2, in particular the portions of the first 20a and second 20b faces located in the main portion 2a, can receive other components to cool them. For example, in FIG. 1, an opening 22 in the first face 20a of the heatsink 2 is closed by a plate carrying an electronic power module. The plate, by closing the opening 22 of the first face 20a contributes in particular in forming the cooling channel located in the main portion 2a of the heatsink 2. For example, as shown in FIG. 4, a portion 201b of the second face 20b located in the main portion 2b can receive a capacitor that will be cooled by the main portion 2a. As the power module and the capacitor generally give off a lot of heat by the Joule effect, it is advantageous to arrange them on the main portion 2a of the heatsink.

In an alternative not shown, the components 12, 16 can be sandwiched between the busbar 4 and the heatsink 2, which improves the cooling of the components 12, 16. In this particular case, the structure of the faces 20a, 20b of the heatsink 2 can be adapted to the size of the components 12, 16. The surface of the heatsink 2 against which the components 12, 16 come can take the different heights and shapes of the components 12, 16 into account in order to ensure the cooling thereof. For example, starting from the heatsink 2, there is firstly a layer of a flexible material 42, electrically insulating but thermally conducting, then the component 12, 16, followed by the electronic board 14 and the busbar 4. Such an arrangement in a sandwich furthermore allows for a firm hold of the components 12, 16. Degradation by vibration is then attenuated. The longevity of the electrical equipment 100 is increased.

The invention claimed is:

1. An electrical equipment comprising:
    a heatsink comprising an internal volume delimited by at least two opposite faces; and
    a busbar, said busbar coming against said two opposite faces of the heatsink in such a way as to be cooled by said heatsink, wherein the busbar extends along the two opposite faces in such a way as to surround the heatsink.

2. The electrical equipment according to claim 1, wherein the heatsink comprises a first side at which said two opposite faces are connected, said busbar extending along said heatsink from the first side returning to said first side.

3. The electrical equipment according to claim 2, wherein an input terminal and an output terminal of said busbar are at said first side of the heatsink.

4. The electrical equipment according to claim 2, wherein said heatsink comprises a second side at which said two opposite faces are connected, said second side being opposite the first side, and wherein said busbar extends along said heatsink from the first side to the second side, then from the second side to the first side.

5. The electrical equipment according to claim 4, wherein said busbar comprises two portions assembled together, the first portion coming against a first of said opposite faces of the heatsink and the second portion coming against the second of said opposite faces of the heatsink, in such a way as to surround said heatsink.

6. The electrical equipment according to claim 5, wherein the first portion and the second portion of the busbar are assembled together at the second side of the heatsink.

7. The electrical equipment according to claim 1, wherein said busbar is made from a single piece by surrounding the heatsink.

8. The electrical equipment according to claim 1, wherein the busbar comprises a coating surrounding a leadframe, said coating comprising an opening coming across from a portion of the heatsink, said opening comprising an electrically insulating heatsink material in such a way as to improve the cooling of said leadframe.

9. The electrical equipment according to claim 1, wherein at least one of said opposite faces of the heatsink is configured to cool other components on at least one surface not covered by said busbar.

10. The electrical equipment according to claim 9, wherein said heatsink comprises at least one cooling channel configured to receive a cooling fluid, said cooling channel being at least partially in a zone not covered by said busbar, and a portion of the heatsink surrounded by the busbar being devoid of the cooling channel.

11. An electrical equipment assembly, comprising:
    a heat sink having a main portion and an auxiliary portion, the auxiliary portion having a first surface and a second surface between a first side and a second side of the auxiliary portion, the second surface being opposite to the first surface with an internal volume of the auxiliary portion between the first surface and the second surface; and
    a busbar comprising two lead frames, each of the lead frames having a first portion contacting the first surface of the auxiliary portion and a second portion contacting the second surface of the auxiliary portion.

12. The electrical equipment assembly of claim 11, wherein the first portion of the lead frames extend along the first surface of the auxiliary portion from the first side to the second side, and the second portion of the lead frames extend along the second surface of the auxiliary portion from the first side to the second side.

13. The electrical equipment assembly of claim 12, wherein the first portion and the second portion of the lead frames are joined together at the second side of the auxiliary portion.

14. The electrical equipment assembly of claim 13, wherein the lead frames have electrical connection terminals for an electrical equipment at the first side of the auxiliary portion.

15. The electrical equipment assembly of claim 14, wherein one lead frame is a positive lead frame and another lead frame is a negative lead frame.

16. The electrical equipment assembly of claim 12, wherein the first portion and the second portion of the lead frames are a single piece.

17. The electrical equipment assembly of claim 12, wherein the first portion and the second portion of the lead frames are joined together at the second side of the auxiliary portion by welding, brazing, or screwing.

18. The electrical equipment assembly of claim 11, further comprising an electronic board mounted on the busbar for one or more electronic components.

19. The electrical equipment assembly of claim 11, wherein the main portion of the heat sink comprises cooling channels.

20. An electrical equipment comprising:
a heatsink comprising an internal volume delimited by at least two opposite faces connected to a first side and a second side, wherein the second side is opposite the first side;
a busbar, said busbar coming against said two opposite faces of the heatsink in such a way as to be cooled by said heatsink; and
wherein said busbar extends along said heatsink from the first side to the second side, then from the second side to the first side.

* * * * *